(12) United States Patent
Hyyppä et al.

(10) Patent No.: US 11,778,928 B2
(45) Date of Patent: Oct. 3, 2023

(54) QUANTUM PROCESSING UNIT COMPRISING ONE OR MORE SUPERCONDUCTING QUBITS BASED ON PHASE-BIASED LINEAR AND NON-LINEAR INDUCTIVE-ENERGY ELEMENTS

(71) Applicant: IQM Finland Oy, Espoo (FI)

(72) Inventors: Eric Hyyppä, Espoo (FI); Mikko Möttönen, Espoo (FI); Juha Hassel, Espoo (FI); Jani Tuorila, Espoo (FI)

(73) Assignee: IQM FINLAND OY, Espoo (FI)

( * ) Notice: Subject to any disclaimer, the term of this patent is extended or adjusted under 35 U.S.C. 154(b) by 30 days.

(21) Appl. No.: 17/337,137

(22) Filed: Jun. 2, 2021

(65) Prior Publication Data
US 2022/0190027 A1 Jun. 16, 2022

(30) Foreign Application Priority Data
Dec. 14, 2020 (EP) .................................... 20213787

(51) Int. Cl.
*H10N 69/00* (2023.01)
*G06N 10/00* (2022.01)
*H01P 7/08* (2006.01)
*H10N 60/12* (2023.01)
*H10N 60/80* (2023.01)

(52) U.S. Cl.
CPC ............. *H10N 69/00* (2023.02); *G06N 10/00* (2019.01); *H01P 7/086* (2013.01); *H10N 60/12* (2023.02); *H10N 60/805* (2023.02)

(58) Field of Classification Search
CPC ............................. G06N 10/00; G06N 10/40
See application file for complete search history.

(56) References Cited

U.S. PATENT DOCUMENTS

2011/0241765 A1 10/2011 Pesetski et al.
2019/0044668 A1 2/2019 Elsherbini et al.

FOREIGN PATENT DOCUMENTS

| EP | 3217336 | 9/2020 |
|----|---------|--------|
| WO | 2017058194 A1 | 4/2017 |
| WO | 2017105429 A1 | 6/2017 |
| WO | 2020152393 | 7/2020 |

OTHER PUBLICATIONS

Y. Nakamura, et al., "Coherent control of macroscopic quantum states in a single-Cooper-pair box. Nature" 398:786-788, 1999.
(Continued)

*Primary Examiner* — Matthew L Reames
(74) *Attorney, Agent, or Firm* — K&L Gates LLP

(57) ABSTRACT

A quantum processing unit is disclosed. The quantum processing unit includes at least one superconducting qubit that is based on phase-biased linear and non-linear inductive-energy elements. A superconducting phase difference across the linear and non-linear inductive-energy elements is biased, for example, by an external magnetic field, such that quadratic potential energy terms of the linear and non-linear inductive-energy elements are cancelled at least partly. In a preferred embodiment, such cancellation is at least 30%. The partial cancellation of the quadratic potential energy terms makes it possible to implement a high-coherence high-anharmonicity superconducting qubit design.

24 Claims, 11 Drawing Sheets

(56) References Cited

OTHER PUBLICATIONS

Koch, M. Y., et al., "Charge-insensitive qubit design derived from the Cooper pair box"; Physical Review A, 76:042319, 2007.
R. Barends, et al. "Coherent Josephson qubit suitable for scalable quantum integrated circuits"; Physical review letters, 111:080502, 2013.
I. Chiorescu, et al., "Coherent quantum dynamics of a superconducting flux qubit"; Science, 299:1869-1871, 2003.
J. Q. You, et al., "Low-decoherence flux qubit" Physical Review B, 75:140515, 2007.
R. W. Simmonds, et al., "Decoherence in Josephson phase qubits from junction resonators"; Physical Review Letters 93:077003, 2004.
V. E. Manucharyan et al., "Fluxonium: Single Cooper-pair circuit free of charge offsets"; Science, 326:113-116, 2009.
F. Yan, et al., "Engineering framework for optimizing superconducting qubit designs"; arXiv preprint arXiv:2006.04130, 2020.
A. Gyenis, et al., "Experimental realization of an intrinsically error-protected superconducting qubit"; arXiv preprint arXiv:1910.07542 (2019).
P. Brooks, et al., "Protected gates for superconducting qubits"; Physical Review A 87.5 (2013): 052306.
L. Grunhaupt, et al., "Granular aluminium as a superconducting material for high-impedance quantum circuits" Nature materials, 18:816-819, 2019.
Pita-Vidal, Marta, et al., "A gate-tunable, field-compatible fluxonium"; arXiv preprint, arXiv:1910.07978, 2019.
N. Earnest et al., "Realization of a Λ system with metastable states of a capacitively shunted fluxonium"; Physical Yeview letters 120.15 (2018): 150504.
J. Bourassa, et al., "Josephson-junction-embedded transmission-line resonators: From Kerr medium to in-line transmon"; Physical Review A 86: 013814, 2012.
M. Fischer, et al., "In-situ tunable nonlinearity and competing signal paths in coupled superconducting resonators"; arXiv preprint arXiv:2009.13492, 2020.
M. Peruzzo, et al. "Surpassing the resistance quantum with a geometric superinductor"; arXiv preprint arXiv:2007.01644 (2020).
Extended European Search Report issued to 20213787.3, dated Jun. 6, 2021, 10 pages.
Siddiqi; "Superconducting qubits: poised for computing?"; Quantum Nanoelectronics Laboratory, Department of Physics, University of California, published online Jul. 2, 2011, 9 pages.
Hazard et al., "Improving Quantum Hardware: Building New Superconducting Qubits and Couplers", dissertation, Princeton University, Jun. 2019, 136 pages.
Hyyppa et al., "Unimon Qubit", IQM, QCD Labs, VTT Technical Research Centre of Finland Ltd. & QTF Center of Excellence, arXiv: 2203 0589v1, Mar. 11, 2022, 37 pages.
International Search Report issued to PCT/FI2021/050872, dated Apr. 25, 2022, 6 pages.

QUANTUM PROCESSING UNIT COMPRISING ONE OR MORE SUPERCONDUCTING QUBITS BASED ON PHASE-BIASED LINEAR AND NON-LINEAR INDUCTIVE-ENERGY ELEMENTS

PRIORITY CLAIM

This application claims priority to European Patent Application No. 20213787.3, filed on Dec. 14, 2020, the entire disclosure of which is incorporated by reference herein.

TECHNICAL FIELD

The invention is generally related to the field of quantum computing. In particular, the invention is related to a quantum processing unit comprising at least one superconducting qubit based on phase-biased linear and non-linear inductive-energy elements, as well as to a quantum computer using one or more such quantum processing units.

BACKGROUND

A quantum computing device, also referred to as a quantum computer, uses quantum mechanical phenomena, such as superposition and entanglement, to solve required computational tasks. Unlike a conventional computer that manipulates information in the form of bits (e.g., "1" or "0"), the quantum computer manipulates information using qubits. A qubit may refer not only to a basic unit of quantum information but also to a quantum device that is used to store one or more qubits of information (e.g., the superposition of "0" and "1").

The quantum computer may be implemented based on superconducting circuits comprising superconducting qubits and resonators. There are several types of superconducting qubits including, for example, charge qubits, transmons, persistent-current flux qubits, C-shunt flux qubits, phase qubits, fluxoniums, and 0-π-qubits. Each of these qubit types has both their advantages and disadvantages. For example, the charge qubits have a high anharmonicity that is optimal for fast single-qubit operations, but they simultaneously suffer from very short coherence times due to detrimental dephasing arising from charge noise. Due to poor coherence properties, charge qubits, persistent-current flux qubits, and phase qubits are not used in modern quantum computers.

The longest measured relaxation and coherence times of superconducting qubits have been achieved with the fluxoniums. In a fluxonium, a Josephson junction is shunted by a superinductor that has a large inductance but a small capacitance. This inductive shunt makes a fluxonium-based circuit immune to low-frequency charge noise. The superinductor of a fluxonium qubit is usually implemented by using a Josephson junction array or a superconducting nanowire with a high kinetic inductance. The fluxoniums are also well protected from magnetic flux noise that couples to the fluxonium-based circuit mainly through the superinductor.

However, the fluxoniums may be difficult to implement and to operate. The latter hinders their application, for example, in fast and accurate quantum logic gates. Furthermore, the so-called heavy fluxoniums, which are implemented by shunting an ordinary fluxonium with a large geometric capacitor can require a several-photon Raman process to excite the qubit from its ground state to its excited state. The same disadvantages are also peculiar to the 0-π-qubits.

SUMMARY

This summary is provided to introduce a selection of concepts in a simplified form that are further described below in the detailed description. This summary is not intended to identify key features or essential features of the invention, nor is it intended to be used to limit the scope of the invention.

The objective of the invention is to provide a high-coherence high-anharmonicity superconducting qubit design.

The objective above is achieved by the features of the independent claims in the appended claims. Further embodiments and examples are apparent from the dependent claims, the detailed description, and the accompanying drawings.

According to a first aspect, a quantum processing unit is provided. The quantum processing unit comprises a dielectric substrate and at least one superconducting qubit provided on the dielectric substrate. Each of the at least one superconducting qubit comprises a linear inductive-energy element and a non-linear inductive-energy element. The linear inductive-energy element is superconductive. Each of the at least one superconducting qubit further comprises a phase-biasing element configured to bias a superconducting phase difference across the linear inductive-energy element and the non-linear inductive-energy element such that quadratic potential energy terms of the linear inductive-energy element and the non-linear inductive-energy element are at least partly cancelled by one another. Such a configuration of the quantum processing unit provides the following advantages:

the (at least partial) mutual cancellation of the quadratic potential energy terms of the non-linear and linear inductive-energy elements may increase the anharmonicity of the superconducting qubit(s); and often (but perhaps not always), the largest cancellation may occur at a flux-insensitive sweet spot, where the superconducting qubit(s) is(are) insensitive to flux noise-induced dephasing to the first order.

In one embodiment of the first aspect, the phase-biasing element is configured to bias the superconducting phase difference such that the quadratic potential energy terms of the linear inductive-energy element and the non-linear inductive-energy element are cancelled by at least 30%. Such cancellation may significantly increase the anharmonicity of the superconducting qubit(s).

In some embodiments of the first aspect, the linear inductive-energy element comprises one or more geometric inductors, and the non-linear inductive-energy element comprises one or more Josephson junctions or kinetic inductors. This may make the processing unit according to the first aspect more flexible in use.

In one embodiment of the first aspect, each of the at least one superconducting qubit further comprises a capacitive-energy element. By using the capacitive-energy element, it is possible to modify the energy spectrum of the qubit and its sensitivity to different noise sources.

In one embodiment of the first aspect, the capacitive-energy element comprises one or more interdigitated capacitors, gap capacitors, parallel-plate capacitors, or junction capacitors. This may make the processing unit according to the first aspect more flexible in use.

In one embodiment of the first aspect, the phase-biasing element is configured to bias the superconducting phase difference by generating and threading a magnetic field through the at least one superconducting qubit or by applying a predefined voltage to the non-linear inductive-energy element. By so doing, it is possible to bias the superconducting phase difference more efficiently.

In one embodiment of the first aspect, the phase-biasing element comprises one or more coils and/or flux-bias lines. By using the coil(s) and/or the flux line(s), it is possible to provide magnetic flux control.

In one embodiment of the first aspect, the at least one superconducting qubit comprises two or more superconducting qubits capacitively and/or inductively coupled to each other on the dielectric substrate. By so doing, it is possible to store and manipulate multiple qubits, thereby making the quantum processing unit according to the first aspect more flexible in use.

In one embodiment of the first aspect, the at least one superconducting qubit comprises two or more superconducting qubits. In this embodiment, the quantum processing unit further comprises one or more coupling resonators and/or tunable couplers for coupling the superconducting qubits on the dielectric substrate. By so doing, it is possible to store and manipulate multiple qubits, thereby making the quantum processing unit according to the first aspect more flexible in use.

In one embodiment of the first aspect, the quantum processing unit further comprises signal lines provided on the dielectric substrate. The signal lines are configured to provide (e.g., from an external control unit) control signals to the superconducting qubit(s). The signal lines may comprise radio-frequency lines, and the control signals may comprise microwave pulses. The control signals may allow one to control the superconducting qubit(s) in a desired manner.

In one embodiment of the first aspect, the quantum processing unit further comprises readout lines provided on the dielectric substrate. The readout lines are configured to measure states of the superconducting qubit(s). The readout lines may be coupled to the superconducting qubit(s) via readout resonators. By using the readout lines, it is possible to provide state measurements of the superconducting qubit(s), thereby making the quantum processing unit according to the first aspect more flexible in use.

In one embodiment of the first aspect, the at least one qubit is configured as a distributed-element resonator comprising at least two conductors separated by at least one gap. In this embodiment, at least one of the conductors serves as the linear inductive-energy element, and the non-linear inductive-energy element comprises at least one Josephson element embedded in the distributed-element resonator. Moreover, the phase-biasing element is configured to bias the superconducting phase difference by generating and threading a magnetic field through the at least one gap of the distributed-element resonator. By so doing, it is possible to increase the anharmonicity of the superconducting qubit(s).

In one embodiment of the first aspect, the distributed-element resonator is configured as a coplanar waveguide (CPW) resonator. In this embodiment, the at least two conductors are represented by a center superconductor and a superconducting ground plane separated by gaps from each other in the CPW resonator. The center superconductor serves as the linear inductive-energy element. Moreover, in this embodiment, the at least one Josephson junction is embedded in the CPW resonator such that the quantum processing unit is free of isolated superconducting islands. By using such a CPW resonator, one may obtain the following advantages:

the inductance and the capacitance of the CPW resonator shunt the Josephson junction(s), thereby providing protection against low-frequency charge noise;

the geometry of the CPW resonator exhibits low dielectric losses;

due to the above-mentioned protection against the charge noise, it is possible to avoid severe dephasing of the superconducting qubit(s), thereby achieving long coherence times;

by making the potential energies of the Josephson junction(s) and the center superconductor of the CPW resonator approximately equal to each other, it is possible to use an external magnetic flux to (at least partly) cancel the quadratic energy terms in the total potential energy of the superconducting qubit(s), thereby resulting in the high anharmonicity of the superconducting qubit(s); and such a configuration of the superconducting qubit(s) allows one to embed a relatively small (compared to the prior art superconducting qubits) number of Josephson junctions (e.g., only a single or few) in the superconducting qubit(s), which renders the fabrication process of the superconducting qubit(s) and, consequently, the whole quantum processing unit according to the first aspect relatively simple and cheap.

In one embodiment of the first aspect, the center superconductor of the CPW resonator has a first and second pair of opposite sides. The superconducting ground plane is formed on the dielectric substrate such that the center superconductor is galvanically connected to the superconducting ground plane on the first pair of opposite sides and separated by the gaps from the superconducting ground plane on the second pair of opposite sides. Such a configuration of the superconducting qubit(s) has the following advantages:

the grounded (on the first pair of opposite sides) center superconductor of the resonator ensures that there are no isolated superconducting islands in the qubit circuit, which may render the qubit immune to low-frequency charge noise;

the grounded (on the first pair of opposite sides) center superconductor of the resonator may turn the superconducting qubit into a gradiometric circuit that is protected against magnetic flux noise, the spatial scale of which exceeds the characteristic width of the resonator;

due to the protection against the magnetic flux noise (in addition to the above-mentioned protection against charge noise), it is possible to avoid severe dephasing of the qubit device more efficiently, thereby achieving longer coherence times.

In one embodiment of the first aspect, the ground plane comprises opposite portions physically separated from each other by the center superconductor and the gaps. In this embodiment, the opposite portions are connected with each other via air bridges stretching over the gaps and the center superconductor. By so doing, it is possible to suppress parasitic slot line modes of the resonator.

In one embodiment of the first aspect, the Josephson junction(s) is(are) embedded in the center superconductor of the CPW resonator. In this embodiment, the center superconductor is interrupted by the Josephson junction(s) serving as the non-linear inductive-energy element that increases the anharmonicity of the modes of the superconducting qubit.

In one embodiment of the first aspect, the center superconductor of the CPW resonator has a parallel connection of two Josephson junctions embedded therein. This may make the superconducting qubit more flexible in use. For example, by so doing, it is possible to implement a superconducting quantum interference device (SQUID) loop in the superconducting qubit.

In one embodiment of the first aspect, the Josephson junction(s) is(are) centrally arranged in the center superconductor of the CPW resonator. By arranging the Josephson junction(s) in the middle or center of the center superconductor, it is possible to increase the anharmonicity of the modes of the superconducting qubit by at least a factor of 2.

In one embodiment of the first aspect, the superconducting qubit comprises a first Josephson junction embedded in the center superconductor of the CPW resonator and at least one second Josephson junction arranged in one or more of the gaps in the vicinity of the first Josephson junction. Each of the at least one second Josephson junction connects the center superconductor to the superconducting ground plane via the corresponding gap. This configuration of the superconducting qubit may allow a more flexible mode structure and a more flexible energy spectrum of each mode.

In one embodiment of the first aspect, the at least one second Josephson junction comprises an even number of second Josephson junctions arranged symmetrically relative to the first Josephson junction. By doing so, it may be possible to provide a better operating behavior of the superconducting qubit.

In one embodiment of the first aspect, the center superconductor of the CPW resonator has a linear or curved shape. This may provide various configurations of the superconducting qubit, depending on particular applications.

In one embodiment of the first aspect, the quantum processing unit further comprises at least one 3D cavity. In this embodiment, the dielectric substrate with the at least one superconducting qubit is provided inside the at least one 3D cavity. By placing the superconducting qubit(s) inside the at least one 3D cavity, it may be possible to achieve longer relaxation and coherence times due to a reduced surface participation ratio.

According to a second aspect, a quantum computer is provided. The quantum computer comprises at least one qubit device according to the first aspect and a control unit configured to perform computing operations by using the at least one quantum processing unit. By using such a quantum processing unit, one may increase the efficiency, functionality and processing speed of the quantum computer.

Other features and advantages of the invention will be apparent upon reading the following detailed description and reviewing the accompanying drawings.

BRIEF DESCRIPTION OF THE DRAWINGS

The invention is explained below with reference to the accompanying drawings in which.

DETAILED DESCRIPTION

Figure 1:
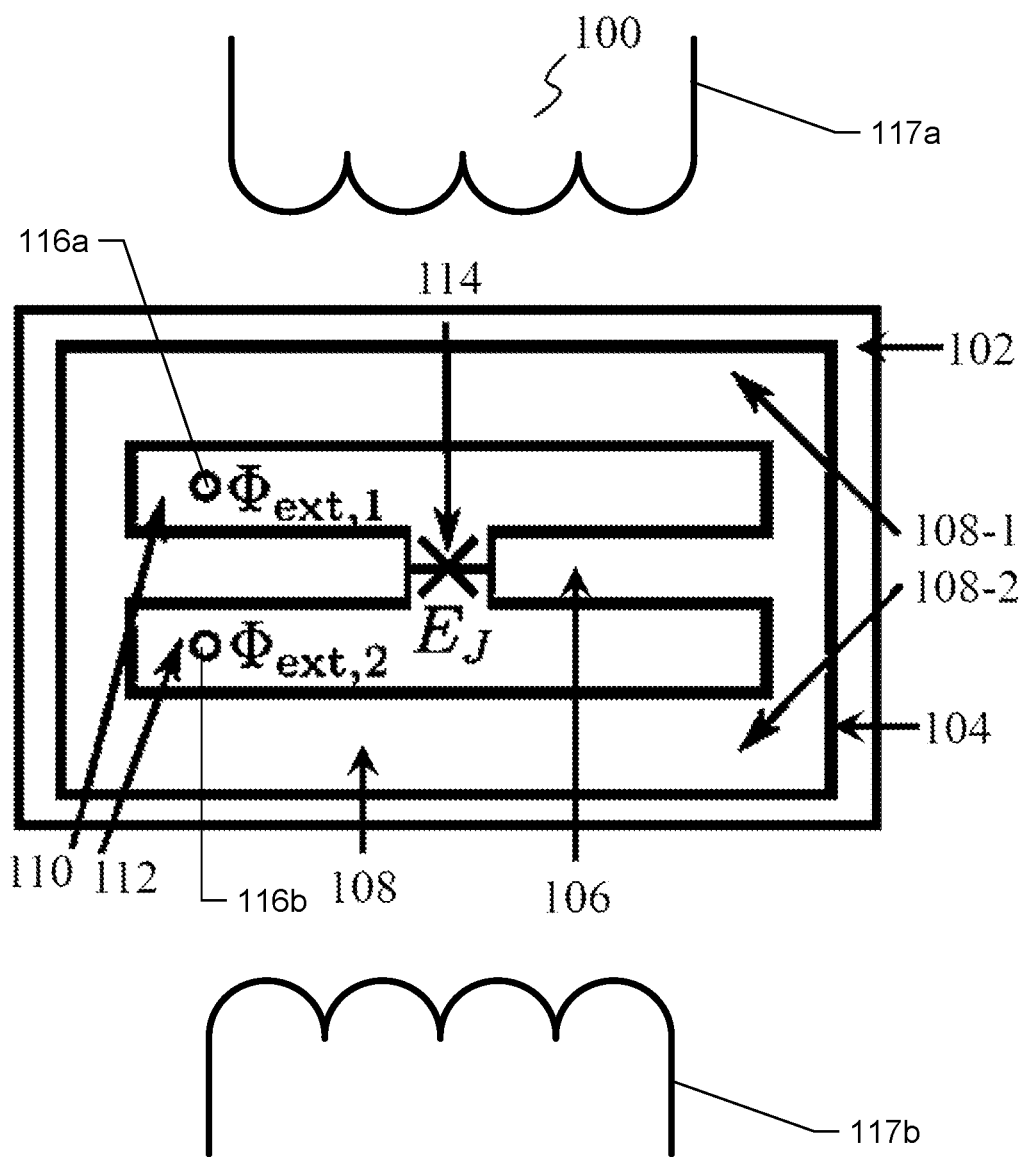
FIG. 1 shows a schematic top view of a quantum processing unit (QPU), in accordance with a first exemplary embodiment.

Various embodiments of the invention are further described in more detail with reference to the accompanying drawings. However, the invention may be embodied in many other forms and should not be construed as limited to any certain structure or function discussed in the following description. In contrast, these embodiments are provided to make the description of the invention detailed and complete.

According to the detailed description, it will be apparent to the ones skilled in the art that the scope of the invention encompasses any embodiment thereof, which is disclosed herein, irrespective of whether this embodiment is implemented independently or in concert with any other embodiment of the invention. For example, the device disclosed herein may be implemented in practice by using any number of the embodiments provided herein. Furthermore, it should be understood that any embodiment of the invention may be implemented using one or more of the elements presented in the appended claims.

The word "exemplary" is used herein in the meaning of "used as an illustration". Unless otherwise stated, any embodiment described herein as "exemplary" should not be construed as preferable or having an advantage over other embodiments.

Any positioning terminology, such as "left", "right", "top", "bottom", "above" "below", "upper", "lower", etc., may be used herein for convenience to describe one element's or feature's relationship to one or more other elements or features in accordance with the figures. It should be apparent that the positioning terminology is intended to encompass different orientations of the device disclosed herein, in addition to the orientation(s) depicted in the figures. As an example, if one imaginatively rotates the device in the figures 90 degrees clockwise, elements or features described as "left" and "right" relative to other elements or features would then be oriented, respectively, "above" and "below" the other elements or features. Therefore, the positioning terminology used herein should not be construed as any limitation of the invention.

Although the numerative terminology, such as "first", "second", etc., may be used herein to describe various embodiments, it should be understood that these embodiments should not be limited by this numerative terminology. This numerative terminology is used herein only to distinguish one embodiment from another embodiment. Thus, a first embodiment discussed below could be called a second embodiment, without departing from the teachings of the invention.

As used in the embodiments disclosed herein, a superconducting qubit may refer to a superconducting quantum device configured to store one or more quantum bits of information (or qubits for short). In this sense, the superconducting qubit serves as a quantum information storage and processing device.

According to the embodiments disclosed herein, a quantum processing unit (QPU), also referred to as a quantum processor or quantum chip, may relate to a physical (fabricated) chip that contains at least one superconducting qubit or a number of superconducting qubits that are interconnected (e.g., to form quantum logic gates). For example, this interconnection may be implemented as capacitive and/or inductive couplings, or it may be performed by using any suitable coupling means, such as coupling resonators, tunable couplers, etc. The QPU is the foundational component of a quantum computing device, also referred to as a quantum computer, which may further include a housing for the QPU, control electronics, and many other components. In general, the quantum computing device may perform different qubit operations by using the superconducting qubit, including reading the state of a qubit, initializing the state of the qubit, and entangling the state of the qubit with the states of other qubits in the quantum computing device, etc. Existing implementation examples of such quantum computing devices include superconducting quantum computers, trapped ion quantum computers, quantum computers based on spins in semiconductors, quantum computers based on cavity quantum electrodynamics, optical photon quantum computers, quantum computers based on defect centers in diamond, etc.

It should be noted that anharmonicity and coherence may be considered as two of the most important properties for single superconducting qubits. The anharmonicity may be defined as $\alpha/(2\pi)=(E_{12}-E_{01})/h$, where $E_{12}$ is the energy difference between states 1 and 2, $E_{01}$ is the energy difference between states 0 and 1, and h is Planck's constant. In practice, the anharmonicity affects the shortest possible duration of single-qubit gates, and the anharmonicity should be high enough to perform fast single-qubit gates with small leakage errors to non-computational states. On the other hand, the coherence of qubits may be quantitatively described with relaxation time $T_1$ and coherence time $T_2$. In general, a large ratio between the coherence/relaxation time and the gate duration is desirable, since this determines the number of quantum gates that may be applied before quantum information has been lost to the environment.

The exemplary embodiments disclosed herein provide a high-coherence high-anharmonicity superconducting qubit design to be used in a QPU. This design is provided by combining phase-biased linear and non-linear inductive-energy elements in a superconducting qubit. The term "phase-biased" used herein refers to biasing a superconducting phase difference across the linear and non-linear inductive-energy elements. To the knowledge of the present authors, such a combination of the phase-biased linear and non-linear inductive-energy elements has not yet been used in the superconducting qubits known from the prior art. It is important to note that the superconducting phase difference is biased such that quadratic potential energy terms of the linear and non-linear inductive-energy elements are cancelled at least partly by one another. A more quantitative metric for measuring the cancellation is discussed below. In a preferred embodiment, such a cancellation is at least 30%.

In the exemplary embodiments disclosed herein, the superconducting phase difference of a circuit element may refer to a physical magnitude defined as:

$$\varphi(t) = \frac{2\pi}{\Phi_0} \int_{-\infty}^{t} V(\tau) d\tau,$$

where $\varphi(t)$ is the superconducting phase difference at time t, $V(t)$ is the corresponding voltage difference across the circuit element, $\Phi_0=h/(2e)$ is the flux quantum, and e is the electron charge. Note that the superconducting phase difference is related to a corresponding branch flux via a scale transformation.

The linear inductive-energy elements may be represented by geometric or linear inductors. In the exemplary embodiments disclosed herein, a geometric or linear inductor may refer to a superconducting inductor having a geometric inductance that may be defined as:

$$L=\Phi/I,$$

where I denotes the electric current through the inductor, and $\Phi$ denotes the magnetic flux generated by the current. The geometric inductance depends on the geometry of the inductor. For example, the geometric inductor may be implemented as a wire, coil, or a center conductor of a distributed-element resonator (in particular, a CPW resonator), depending on particular applications.

The non-linear inductive-energy elements may be represented by one or more Josephson junctions or kinetic inductors. In the exemplary embodiments disclosed herein, a kinetic inductor may refer to a non-linear superconducting inductor whose inductance arises mostly from the inertia of charge carriers in the inductor. In turn, the term "Josephson junction" is used herein in its ordinary meaning and may refer to a quantum mechanical device made of two superconducting electrodes which are separated by a barrier (e.g., a thin insulating tunnel barrier, normal metal, semiconductor, ferromagnet, etc.).

The following sections describe how the above-mentioned mutual cancellation of the quadratic potential energy terms of the linear and non-linear inductive-energy elements impacts the anharmonicity of the superconducting qubit. Assuming that the superconducting qubit is represented as a simple circuit model comprising a linear (geometric) inductor shunting a Josephson junction (or Josephson junctions), the total potential energy of the circuit model is defined as:

$$U = \frac{E_L}{2}\varphi^2 - E_J \cos(\varphi - \varphi_{ext}),$$

where $\varphi$ denotes the superconducting phase difference across the linear inductor, $$E_L = \left(\frac{\Phi_0}{2\pi}\right)^2 \frac{1}{L}$$

is the inductive energy of the linear inductor, $E_J$ is the Josephson energy of the Josephson junction, and $\varphi_{ext}$ is the phase bias of the Josephson junction. Note that such a phase bias could be achieved, for example, with an external magnetic flux $\Phi_{ext}=\Phi_0\varphi_{ext}/(2\pi)$ through a loop formed by the Josephson junction and the linear inductor. In this case, a flux quantization condition relates the superconducting phase differences across the linear inductor and the Josephson junction as:

$$-\varphi_J + \varphi = \frac{2\pi}{\Phi_0}\Phi_{ext} + 2\pi m,$$

where $\varphi_J$ is the superconducting phase difference across the Josephson junction, and m is the integer.

If the phase bias equals $\varphi_{ext} = \pm\pi$, the quadratic potential energy terms associated with the linear inductor and the Josephson junction have different signs, on account of which they cancel each other at least partly. In other words, the total potential energy may be approximated to the fourth order as follows:

$$U \approx \frac{E_L - E_J}{2}\varphi^2 + \frac{E_J}{24}\varphi^4,$$

where the cancellation of the quadratic potential energy terms is clearly visible. If $E_L \approx E_J$, the quartic potential energy term may become large as compared with the quadratic potential energy term, thereby resulting in the high anharmonicity of the superconducting qubit corresponding to the above-assumed circuit model.

In order to estimate the amount of the cancellation quantitatively for the total potential energy U, it should be noted that the potential energy of a phase-biased Josephson junction may be expanded into a Taylor series as:

$$-E_J \cos(\varphi - \varphi_{ext}) = \sum_{k=0}^{\infty}\frac{E_{J,k}(\varphi_{ext})}{k!}\varphi^k,$$

where $E_{J,k}(\varphi_{ext})$ denotes the k-th Taylor series coefficient of the potential energy of a phase-biased Josephson junction. This allows one to measure the cancellation effect present in the total potential energy U by using the following ratio:

$$\frac{|E_L + E_{J,2}(\varphi_{ext})|}{\max(E_L, E_J)} = 1 - \beta,$$

where $E_{J,2}(\varphi_{ext})$ denotes the $2^{nd}$ order Taylor series coefficient of the potential energy of a phase-biased Josephson junction, and $\beta$ denotes the amount of the cancellation. The cancellation of at least 30% means that $\beta \geq 0.3$. If, for example, the phase bias equals $\varphi_{ext} = \pm\pi$, then $E_{J,2} = -E_J$ implying that:

$$\frac{|E_L + E_{J,2}(\varphi_{ext})|}{\max(E_L, E_J)} = \frac{|E_L - E_J|}{\max(E_L, E_J)}.$$

In this case, the requirement of $\beta \geq 0.3$ implies that the Josephson energy and the inductive energy must satisfy $$E_J / E_L \in \left[0.3, \frac{1}{0.3}\right].$$

In some embodiments, the above-assumed circuit model may be supplemented with a capacitive-energy element, which is also arranged to shunt the Josephson junction. Such a capacitive-energy element may be implemented as one or more interdigitated capacitors, gap capacitors, parallel-plate capacitors, or junction capacitors.

In some embodiments, one or more superconducting qubits each represented by the combination of the phase-biased linear and non-linear inductive-energy elements may be provided on a dielectric substrate. In some embodiments, the superconducting qubits (together with the dielectric substrate) may be further placed inside one or more 3D cavities.

FIG. 1 shows a schematic top view of a QPU 100, in accordance with a first exemplary embodiment. As shown in FIG. 1, the QPU 100 comprises a dielectric substrate 102 and a superconducting qubit 104 provided on the dielectric substrate 102. In the first embodiment, the superconducting qubit 104 is configured as a CPW resonator comprising a center superconductor 106 and a superconducting ground plane 108. The superconductor 106 is galvanically connected to the superconducting ground plane 108 on a first pair of opposite sides (i.e. left and right sides, as shown in FIG. 1). At the same time, the superconductor 106 is separated by equal gaps 110 and 112 from the superconducting ground plane 108 on a second pair of opposite sides (i.e. top and bottom sides, as shown in FIG. 1). In this case, the superconductor 106 serves as the linear inductive-energy element of the superconducting qubit 104. As for the non-linear inductive-energy element, it is represented by a single Josephson junction 114 embedded in the superconductor 106 such that the QPU 100 is free of superconducting islands. Here, a superconducting island may refer to a Cooper-pair box connected via a tunnel junction to the center superconductor 106. In another example, a superconducting island may be formed between two Josephson junctions embedded in series within the center conductor. It should be noted that all constructive elements of the QPU 100 in FIG. 1 are not shown to scale for convenience. Furthermore, the shape of the center superconductor 106 and the superconducting ground plane 108 are also illustrative and may be modified, depending on particular applications.

Although the superconducting qubit 104 is configured as the CPW resonator, this should not be construed as any limitation of the invention. In other embodiments, the superconducting qubit 104 may be configured as any type of a distributed-element resonator (one example of which is the CPW resonator), or the superconducting qubit 104 may be configured as any other combination of the linear and non-linear inductive-energy elements configured to be phase-biased such that their quadratic potential energy terms are at least partly cancelled by one another.

As for the Josephson junction 114, it may interrupt the center superconductor 106, as shown in FIG. 1. In one embodiment, the Josephson junction 114 may be embedded in the center superconductor 106 such that a current flowing through the center superconductor 106 is equal on both sides of the Josephson junction 114. In another embodiment, the Josephson junction 114 is centrally arranged in the center superconductor 106.

To provide the above-mentioned cancellation, the QPU 100 should also comprise a phase-biasing element, such as coils 117a and 117b. In the first embodiment, the phase-biasing element is intended to be configured to generate and thread respective magnetic fields 116a and 116b through the gaps, i.e., loops, 110 and 112, thereby providing phase biasing in a proper manner. In FIG. 1, $\Phi_{ext,1}$ and $\Phi_{ext,2}$ refer to magnetic fluxes that flow through the gaps 110 and 112 respectively. Thanks to the two parallel loops, the superconducting qubit 104 is gradiometric, meaning that it is protected against flux noise whose spatial scale exceeds the width of the superconducting qubit 104. This phase biasing leads to at least partial mutual cancellation of the quadratic potential energy terms of the superconductor 106 and the Josephson junction 114, thereby improving the anharmonicity of the superconducting qubit 104. The phase-biasing element may comprise one or more coils, as shown, and/or one or more flux-bias lines for providing magnetic flux control. The flux-bias line may be implemented as a superconducting wire on the dielectric substrate 102, and magnetic fields may be generated by tuning a current flowing through the wire. In some other embodiments, such a phase-biasing element may be configured to provide the phase biasing by applying a suitable voltage to the Josephson junction 114, instead of or in addition to threading the magnetic field through the gaps 110 and 112.

Since the Josephson junction 114 is embedded in the CPW resonator such that no isolated superconducting islands are formed, the inductance and the capacitance of the CPW resonator shunt the Josephson junction 114 and provide protection against dephasing arising from low-frequency charge noise. Due to the inductive shunt, the superconducting qubit 104 should be fully immune to the low-frequency charge noise due to its topology unlike the commonly employed transmon qubits, where only the few lowest energy levels are well protected against charge noise.

As can be seen in FIG. 1, the superconducting ground plane 108 comprises opposite upper and lower portions 108-1, 108-2 which are physically separated from each other by the center superconductor 106 and the gaps 110, 112. In one embodiment, these opposite portions may be connected with each other via air bridges stretching over the center superconductor 106 and gaps 110, 112 in order to suppress parasitic slot line modes of the CPW resonator.

Figure 2:
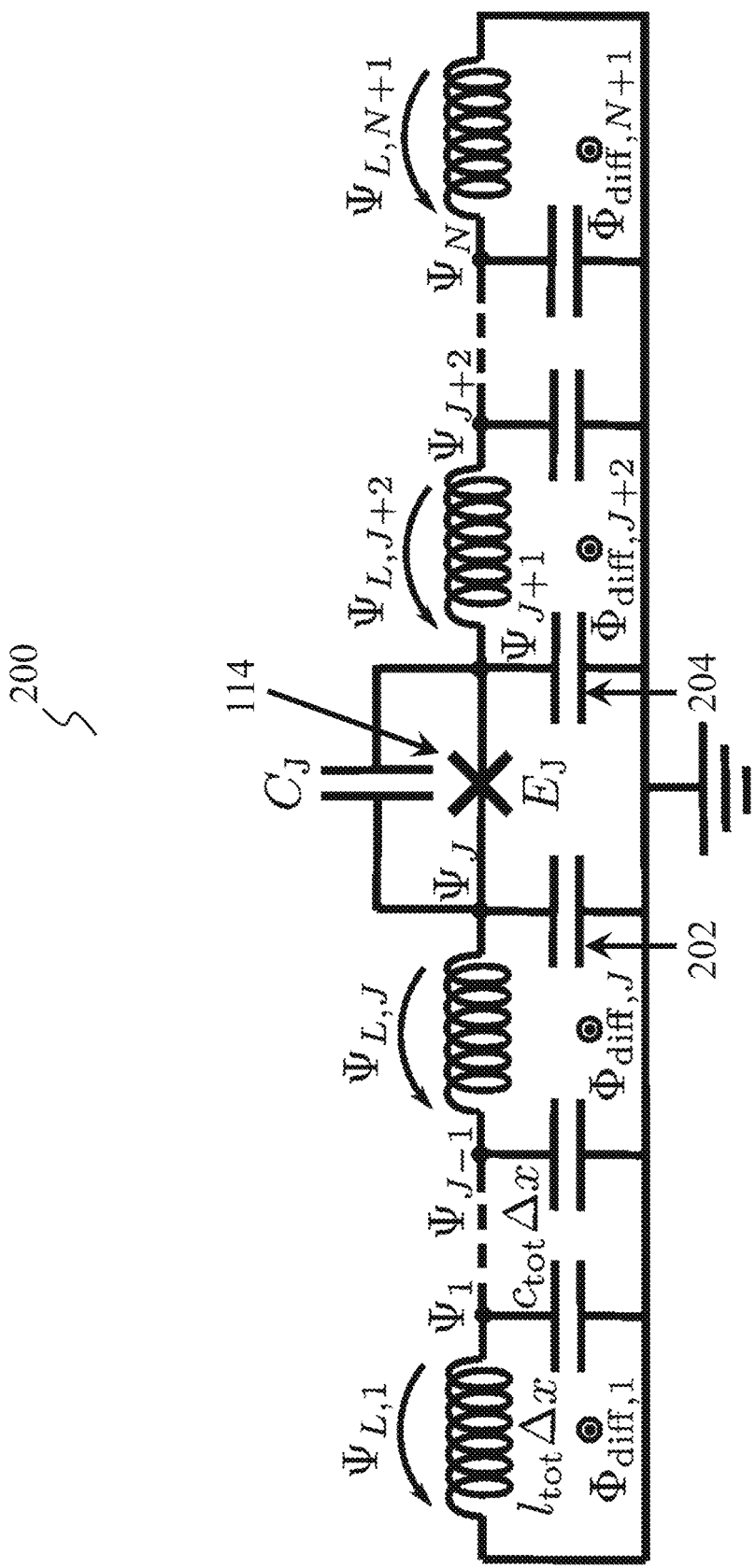
FIG. 2 shows a circuit model used for deriving the Hamiltonian of a superconducting qubit included in the QPU shown in FIG. 1 when it is subjected to an external magnetic flux.

FIG. 2 shows a circuit model 200 used for deriving the Hamiltonian of the superconducting qubit 104 included in the QPU 100 when it is subjected to an external magnetic flux. According to the circuit model 200, the CPW resonator of length 2l is modeled by using N lumped element inductors and capacitors. Additionally, the Josephson junction 114 is assumed to be arranged between capacitors 202 and 204 with indices J and J+1. Due to the gradiometric nature of the two loops, the external magnetic flux in the following calculations is regarded as the (scaled) difference of the external magnetic fluxes on the two sides of the center superconductor 106, i.e. $\Phi_{diff} = (\Phi_{ext,2} - \Phi_{ext,1})/2$. By using the circuit model 200, it is possible to write a classical kinetic energy term T and a potential energy term U for the circuit as:

$$T = \sum_{i=1}^{N} \frac{1}{2} c_{tot} \Delta x \dot{\Psi}_i^2 + \frac{1}{2} C_J (\Psi_{J+1} - \Psi_J)^2,$$

$$U = \frac{1}{2l_{tot}\Delta x}(-\Psi_1 + \Phi_{diff,1})^2 + \frac{1}{2l_{tot}\Delta x}\sum_{i=2, i \neq J+1}^{N}(\Psi_{i-1} - \Psi_i + \Phi_{diff,i})^2 + \frac{1}{2l_{tot}\Delta x}(\Psi_N + \Phi_{diff,N})^2 - E_J \cos\left(\frac{2\pi}{\Phi_0}(\Psi_{J+1} - \Psi_J)\right),$$

where $\Psi_i = \int_{-\infty}^{t} V_i(\tau)d\tau$ is the node flux across the i-th capacitor with voltage $V_i$, $\Phi_{diff,i}$ is the external magnetic flux across the i-th loop, $\Delta x = 2l/N$ is the length scale for discretization, $c_{tot}$ is the total capacitance per unit length of the CPW resonator, $l_{tot}$ is the total inductance per unit length of the CPW resonator, $E_J$ is the Josephson energy, $C_J$ is the capacitance of the Josephson junction 114, and $\Phi_0$ is the flux quantum as above. Additionally, the dots over the symbols denote time derivatives.

Using the Lagrangian formalism, one may then derive the classical equation of motion for the node fluxes within the CPW resonator. In the continuum limit $\Delta x \to 0$, one may obtain the following result:

$$c_{tot}\ddot{\psi} = \frac{1}{l_{tot}}\partial_{xx}\psi - \frac{s}{l_{tot}}\partial_x B_{diff},$$

where $\Psi_i \to \psi(x_i)$ corresponds to the continuum limit of the node flux at location $x_i$, $\Phi_{diff,i}/(s\Delta x) \to B_{diff}$ denotes the effective magnetic field difference, and s is the distance between the center superconductor 106 and the superconducting ground plane 108. Using the Lagrangian formalism, one may also derive a boundary condition for the node flux at the location $x_J^-$ corresponding to the left electrode of the Josephson junction 114:

$$-C_J \Delta\ddot{\psi} - I_c \sin\left(\frac{2\pi}{\Phi_0}\Delta\psi\right) = -\frac{1}{l_{tot}}\partial_x \psi\Big|_{x=x_J^-} + \frac{\Phi_{diff}}{2ll_{tot}},$$

where $\Delta\psi = \Psi_{J+1} - \Psi_J$ is the branch flux across the Josephson junction 114, $I_c = 2\pi E_J/\Phi_0$ is the critical current of the Josephson junction 114, and $\Phi_{diff} = \Sigma_i \Phi_{diff,i}$ is the total external magnetic flux difference. In the above equation, the assumption of a homogenous magnetic field has been utilized to write $\Phi_{diff,i}/\Delta x \to \Phi_{diff}/(2l)$, where 2l is the length of the center superconductor 106. Note that a similar boundary condition may be derived for the right electrode of the Josephson junction 114. Additional boundary conditions $\psi(-l)=0$ and $\psi(l)=0$ arise from the grounding of the center superconductor 106.

Based on the classical equation of motion and the boundary conditions, it follows that the (classical) generalized flux may be described as a linear combination of a dc supercurrent and an infinite number of oscillatory normal modes, namely:

$$\psi(x,t) = \phi_0 u_0(x) + \sum_{n \geq 1} u_n(x)\psi_n(t),$$

where $\phi_0$ is the time-independent coefficient of the "dc mode", and $u_0(x)$ is the corresponding envelope function. In intuitive terms, the dc supercurrent biases the Josephson junction 114, which changes the effective Josephson inductance seen by the oscillatory (ac) normal modes. Here, $\{u_n(x)\}$ are the envelope functions of the oscillatory ac modes and $\{\psi_n(t)\}$ are the corresponding time-dependent coefficients. Importantly, the envelope functions and the corresponding mode frequencies may be derived using the above equation of motion and the above boundary conditions.

To use the CPW resonator with the embedded Josephson junction 114 as the superconducting qubit 104, one should observe that the non-linearity of the Josephson junction 114 turns some of the normal modes into anharmonic oscillators. In the following, we focus on the m-th mode and assume that we would like to operate it as the qubit. With this in mind, it is possible to derive a single-mode approximation for the quantum Hamiltonian that is given by:

$$\hat{H}_m = 4E_{C,m}'(\varphi_0)\hat{n}_m^2 + \frac{1}{2}E_{L,m}(\varphi_0)\hat{\varphi}_m^2 + E_{L\varphi m}(\varphi_{diff}-\varphi_0) - E_J \cos(\hat{\varphi}_m - \varphi_0),$$

where $E_{C,m}'(\varphi_0)$ is the effective charging energy associated with the m-th mode, $\hat{n}_m$ is the charge operator of the m-th mode, $E_{L,m}(\varphi_0)$ is the effective inductive energy of the m-th mode, $\hat{\varphi}_m$ is the phase operator corresponding to the m-th mode, $E_L = \Phi_0^2/(2\pi)^2/(2ll_{tot})$ is the inductive energy associated with the total linear inductance of the CPW resonator, $\varphi_0 = 2\pi\phi_0/\Phi_0$ is the phase bias corresponding to the dc current, and $\varphi_{diff} = 2\pi\Phi_{diff}/\Phi_0$ denotes the phase associated with the external magnetic flux. Note that the phase and charge operators are conjugate operators satisfying the commutation relation $[\hat{\varphi}_m, \hat{n}_m]=i$, where i is the imaginary unit.

It should be noted that the m-th mode of the superconducting qubit 104 is treated quantum-mechanically in the above Hamiltonian, but the dc Josephson phase $\varphi_0$ is treated as a static variable that is computed based on a semiclassical theory. According to the semiclassical theory, the dc Josephson phase is given by the following flux quantization condition:

$$I_c \sin\left(\frac{2\pi}{\Phi_0}\phi_0\right) + \frac{\phi_0}{2ll_{tot}} = \frac{\Phi_{diff}}{2ll_{tot}},$$

where $\phi_0 = \Phi_0\varphi_0/(2\pi)$ is the branch flux associated with the dc Josephson phase.

In general, the anharmonicity $\alpha_m/(2\pi)$ of a given mode may be computed numerically by performing the following steps:

at first, determining the dc Josephson phase using the above-given flux quantization condition;

then, solving the (classical) normal mode frequencies using the following equation that has been derived from the above equation of motion and the above boundary conditions:

$$k_m l \cos(k_m(x_J - l))\cos(k_m(x_J + l)) - \left(\frac{C_J(k_m l)^2}{c_{tot}l} - \frac{l_{tot}l}{L_J}\cos\left(\frac{2\pi\phi_0}{\Phi_0}\right)\right)\sin(2k_m l) = 0,$$

where $k_m = \omega_m\sqrt{c_{tot}l_{tot}}$ is the wavenumber of the m-th mode, and $L_J = \Phi_0/(2\pi I_c)$ is the effective Josephson inductance; and finally, numerically diagonalizing the single-mode Hamiltonian $\hat{H}_m$ to obtain the quantized energy spectrum of the mode of interest for a given external magnetic flux. Using the energy spectrum of the m-th mode, it is straightforward to evaluate the qubit frequency $\omega_q/(2\pi)$ and the corresponding anharmonicity $\alpha_m/(2\pi)$.

Due to the large capacitance per unit length of the CPW resonator, the anharmonicity of the superconducting qubit 104 is only modest unless the parameters of the circuit model 200 are chosen suitably, and an appropriate external magnetic flux is applied. However, if the external magnetic flux equals half of the flux quantum, i.e., $\Phi_{diff}/\Phi_0 = \pm 0.5$, the dc Josephson phase equals $\varphi_0 = \pm\pi$ assuming that the Josephson inductance is larger than the total inductance of the CPW resonator. If the linear inductance of the CPW resonator is only slightly smaller than the Josephson inductance, the quadratic potential energy terms associated with the inductive energy $E_{L,m}(\varphi_0)$ and the Josephson energy $E_J$ cancel each other almost completely, which can result in a large anharmonicity. Using experimentally attainable values of the parameters for the circuit model 200, the present authors have found that the anharmonicity of the lowest-frequency mode may (greatly) exceed 500 MHz for a qubit frequency of approximately 5 GHz if the external magnetic flux is tuned to $\Phi_{diff}/\Phi_0 = \pm 0.5$. It is necessary to note that this also corresponds to a flux-insensitive sweet spot protecting the superconducting qubit 104 against the dephasing induced by the flux noise. Some numerical results are illustrated in FIGS. 3-7.

Figure 3:
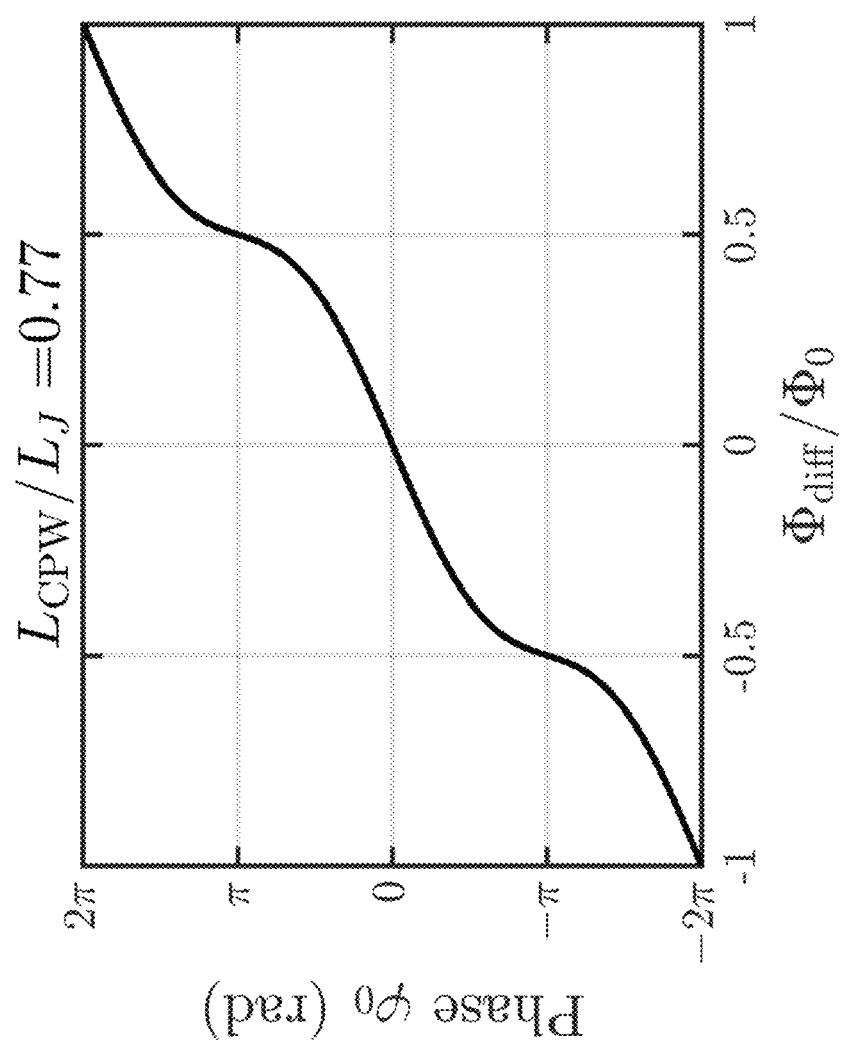
FIG. 3 shows a DC Josephson phase as a function of the external magnetic flux.
Figure 4:
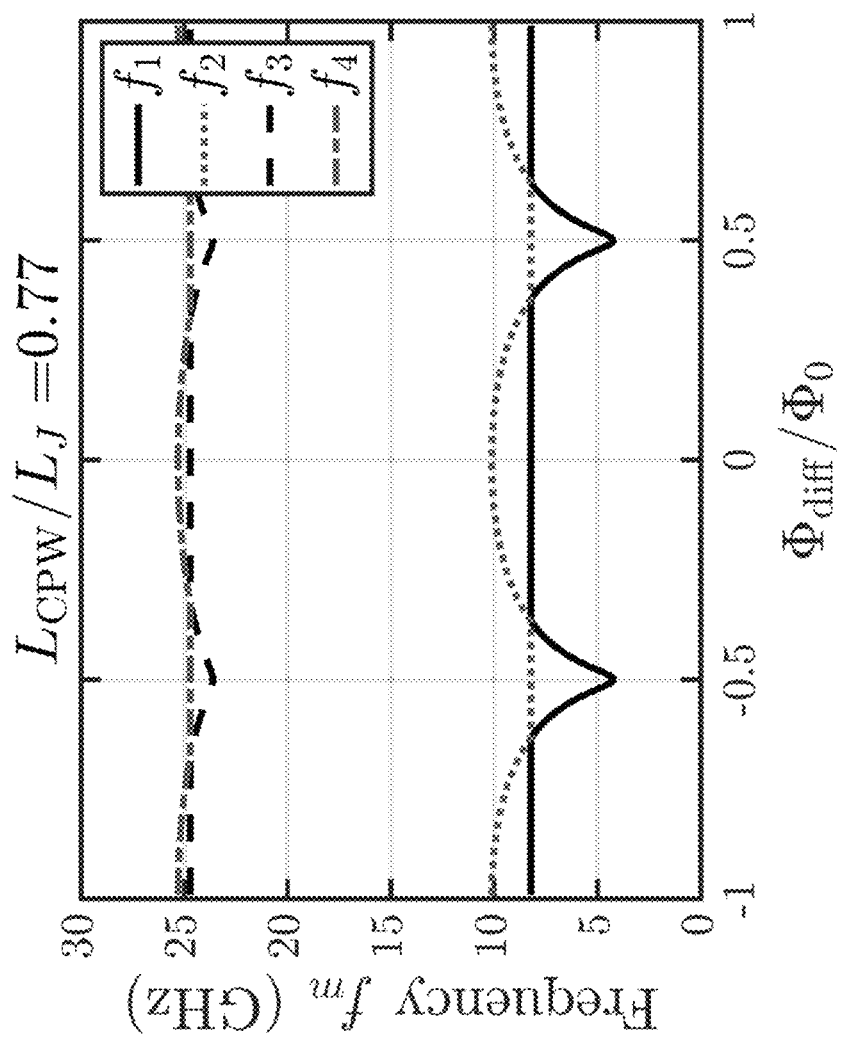
FIG. 4 shows frequencies of the 4 lowest frequency normal modes as a function of the external magnetic flux.
Figure 5:
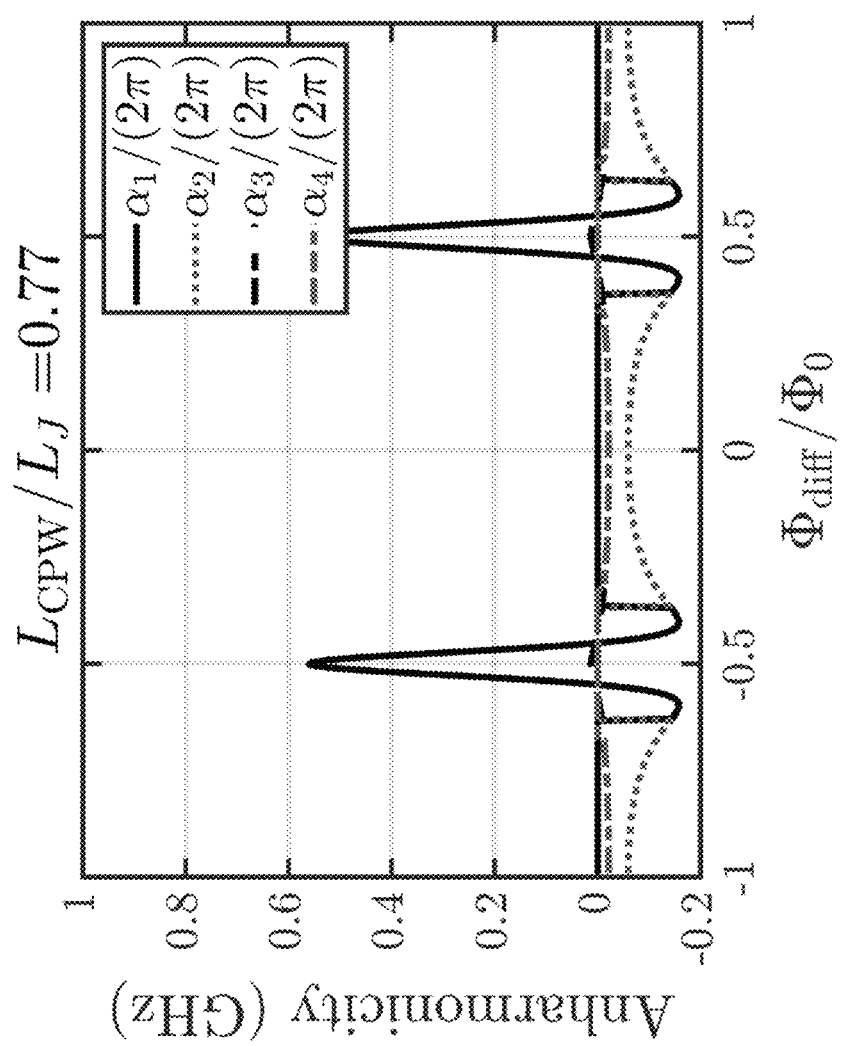
FIG. 5 shows anharmonicities of the 4 lowest frequency normal modes as a function of the external magnetic flux.
Figure 6:
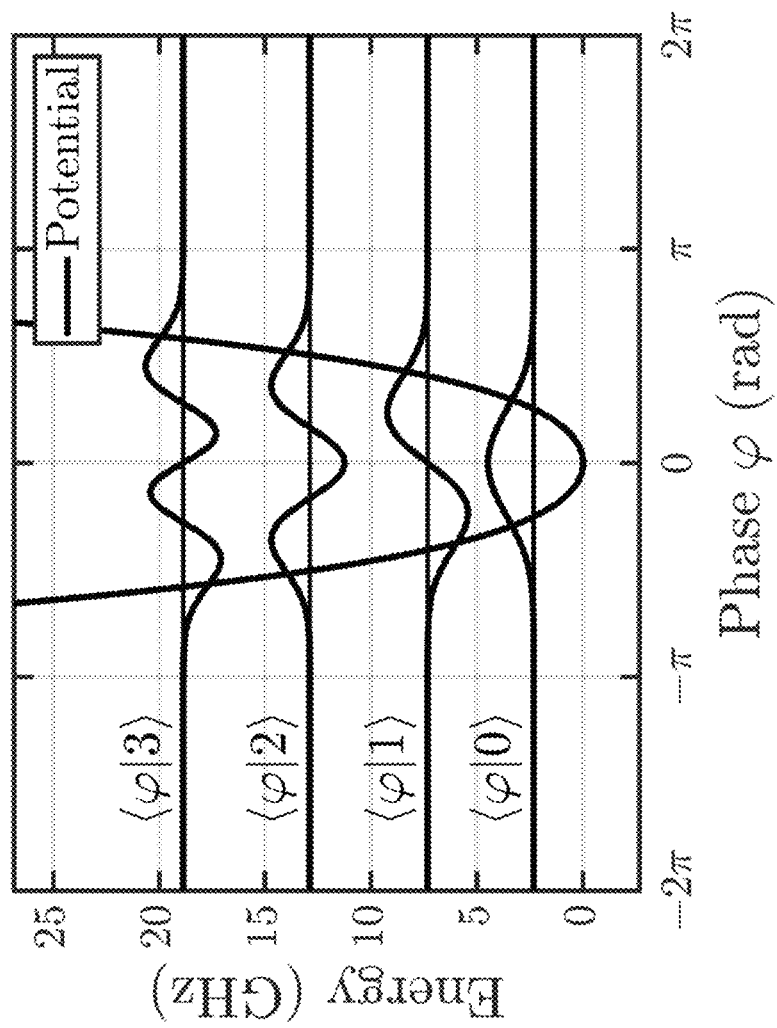
FIG. 6 shows a potential energy landscape and phase-basis wavefunctions for the 4 lowest energy states of the lowest-frequency normal mode.
Figure 7:
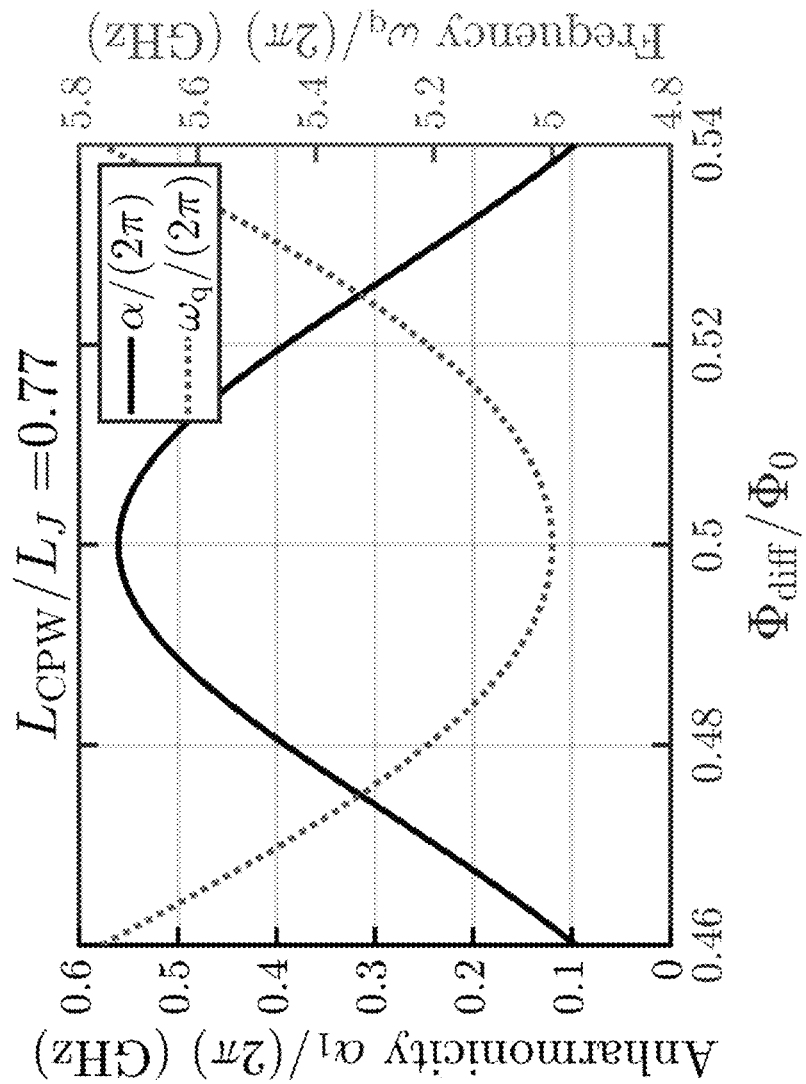
FIG. 7 shows a close-up of the anharmonicity and qubit frequency associated with the lowest frequency normal mode around a sweet spot $\Phi_{diff}/\Phi_0=0.5$.

More specifically, FIG. 3 shows the DC Josephson phase $\varphi_0$ as a function of the external magnetic flux difference $\Phi_{diff}$ for one possible inductance ratio $2ll_{tot}/L_J = L_{CPW}/L_J = 0.77$. FIG. 4 shows frequencies $f_m = \omega_m/(2\pi)$ of the 4 lowest frequency normal modes as a function of the external magnetic flux $\Phi_{diff}$. FIG. 5 shows anharmonicities $\alpha_m/(2\pi)$ of the 4 lowest frequency normal modes as a function of the external magnetic flux $\Phi_{diff}$. Note the large anharmonicity (>500 MHz) of the lowest frequency mode at $\Phi_{diff}/\Phi_0 = 0.5$. FIG. 6 shows a potential energy landscape $U(\varphi_m)$ and phase-basis wavefunctions for the 4 lowest energy states of the lowest-frequency normal mode at $\Phi_{diff}/\Phi_0 = 0.5$. FIG. 7 shows a close-up of the anharmonicity $\alpha_1/(2\pi)$ and qubit frequency $\omega_q/(2\pi)$ associated with the lowest frequency normal mode around $\Phi_{diff}/\Phi_0 \approx 0.5$. Note that $\Phi_{diff}/\Phi_0 = 0.5$ corresponds to a flux-insensitive sweet spot with these parameter values. The parameters used to obtain the numerical results shown in FIGS. 3-7 correspond to the parameter set given in Table 1 below:

Table 1. Exemplary parameters used to estimate the frequencies and anharmonicities of the normal modes in the superconducting qubit 104 subjected to an external magnetic flux.

|  | $x_J/l$ | $2l$ (mm) | $E_J/h$ (GHz) | $C_J$ (fF) | $k_0$ | $\epsilon_{eff}$ | $c_{tot}$ (pF/m) |
|---|---|---|---|---|---|---|---|
| Parameter set | 0.0 | 8.0 | 20.0 | 1.4 | 0.08 | 5.2 | 74 |

|  | $l_g$ (µH/m) | $l_k$ (µH/m) | $l_{tot}$ (µH/m) | $Z_0$ (Ω) | $2ll_{tot}/L_J$ |
|---|---|---|---|---|---|
| Parameter set | 0.78 | 0.0 | 0.78 | 103 | 0.77 |

In Table 1, $x_J/l \in [-1,1]$ is the (relative) location of the Josephson junction 114 in the center superconductor 106 ($x_J/l = 0$ corresponds to the Josephson junction 114 centrally located in the center superconductor 106), $k_0 = w/(w+2s)$ is the ratio describing the geometry of the CPW resonator, w is the width of the center superconductor 106, s is the gap between the center superconductor 106 and the superconducting ground plane (i.e. the gap 110 or 112), $\epsilon_{eff}$ is the effective permittivity of the CPW resonator, $l_k$ is the kinetic inductance per unit length of the resonator, and $l_g$ is the geometric inductance per unit length of the resonator. Furthermore, $Z_0 = \sqrt{l_{tot}/c_{tot}}$ is the characteristic impedance of the CPW resonator.

To improve the anharmonicity further, one may fabricate the center superconductor 106 of the CPW resonator from a superconducting material with a high-kinetic inductance, such as a superconducting thin film. This would increase the inductance of the CPW resonator with respect to the capacitance. As a result, the total capacitance of the CPW resonator could be reduced, which would improve the anharmonicity of the superconducting qubit 104. In such a circuit model, the anharmonicity could exceed 200 MHz even in the absence of an external magnetic flux, and greatly exceed 1 GHz with the external magnetic flux. However, superconducting thin films tend to be relatively lossy and, therefore, the increase in the anharmonicity might be accompanied by a significant decrease in the relaxation and coherence times. For this reason, the approach based on an external flux without any superconducting thin films seems the most promising path towards a high-coherence high-anharmonicity superconducting qubit.

Figure 8B:
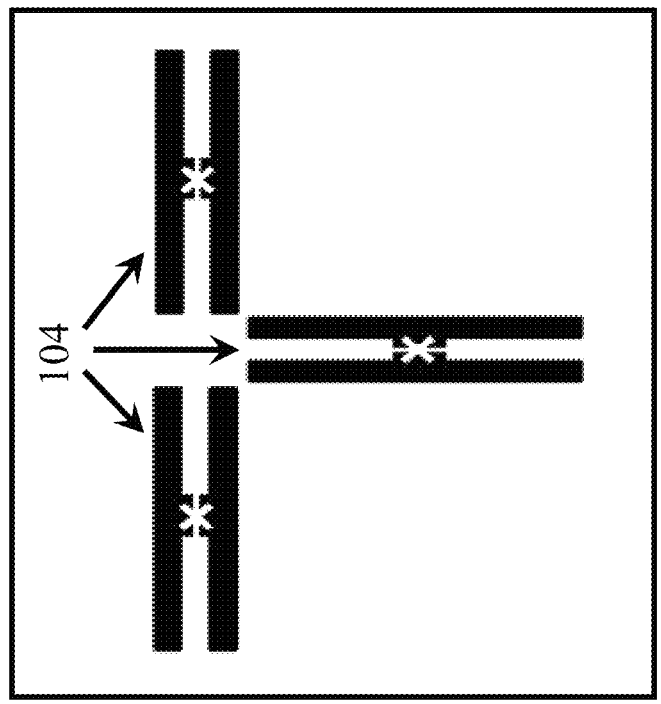
FIGS. 8A and 8B show schematic capacitive (FIG. 8A) and inductive (FIG. 8B) couplings between superconducting qubits, in accordance with the first exemplary embodiment.
Figure 8A:
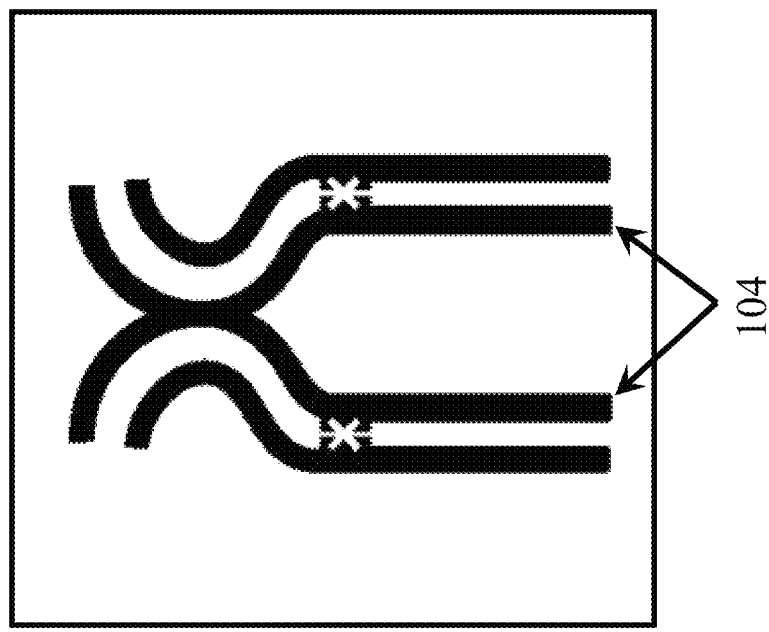

FIGS. 8A and 8B show schematic capacitive and inductive couplings between superconducting qubits in accordance with the first exemplary embodiment. More specifically, FIG. 8A shows a schematic top view of a QPU 800 comprising a combination of two superconducting qubits 104 capacitively coupled to each other. FIG. 8B shows a schematic top view of a QPU 802 comprising a combination of three superconducting qubits 104 inductively coupled to each other. In FIGS. 8A and 8B, the white color denotes the center superconductor 106, the superconducting ground plane 108 and the Josephson junction 114 in each superconducting qubit 104, while the black color denotes the gaps 110 and 112 in each superconducting qubit 104. It should be apparent to those skilled in the art that the number of the superconducting qubits 104 shown in FIGS. 8A and 8B is for illustrative purposes only and should not be construed as any limitation of the invention. Moreover, it should be again noted that the size of the QPUs 800 and 802 and their constrictive elements are not shown to scale for convenience.

Figure 9:
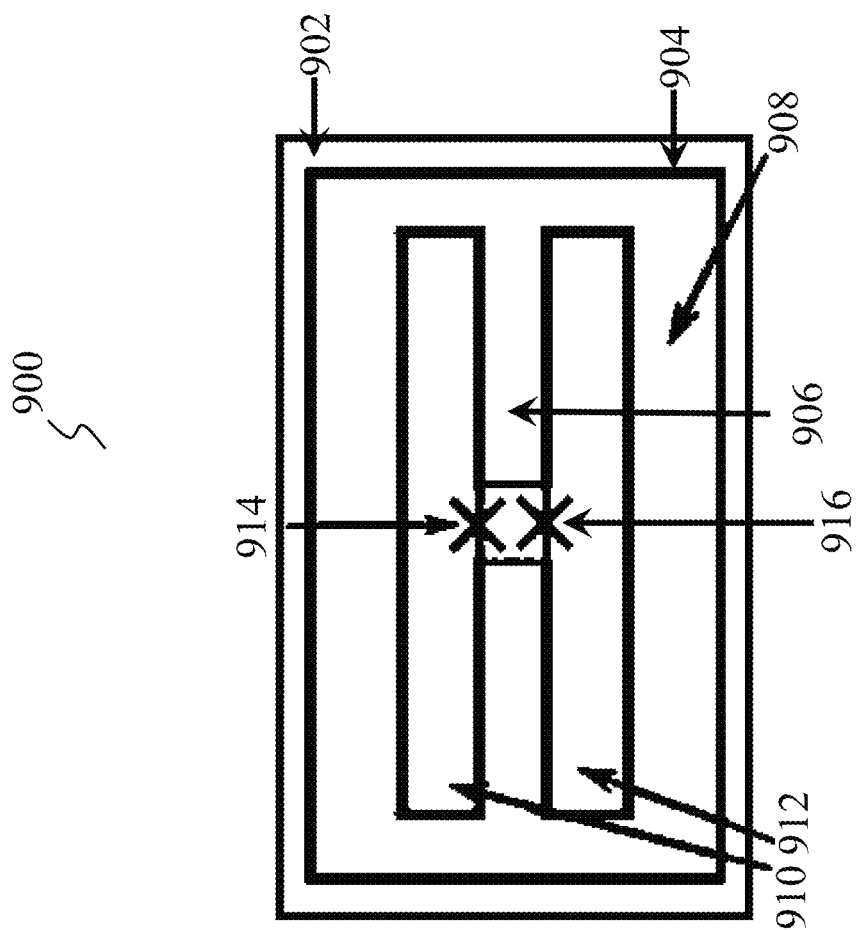
FIG. 9 shows a schematic top view of a QPU, in accordance with a second exemplary embodiment.

FIG. 9 shows a schematic top view of a QPU 900 in accordance with a second exemplary embodiment. Similar to the QPU 100 in the first exemplary embodiment, the QPU 900 comprises a dielectric substrate 902 and a superconducting qubit 904 provided on the dielectric substrate 902. In the second embodiment, the superconducting qubit 904 is also configured as a CPW resonator comprising a center superconductor 906 and a superconducting ground plane 908. The superconductor 906 is galvanically connected to the superconducting ground plane 908 on a first pair of opposite sides (i.e. left and right sides, as shown in FIG. 9). At the same time, the superconductor 906 is separated by equal gaps 910 and 912 from the superconducting ground plane 908 on a second pair of opposite sides (i.e. top and bottom sides, as shown in FIG. 9). The superconductor 906 serves as the linear inductive-energy element of the superconducting qubit 904. Contrary to the first embodiment, the non-linear inductive-energy element in the second embodiment is represented by a combination of two parallel Josephson junctions 914 and 916 embedded in the superconductor 906 such that the QPU 900 is free of superconducting islands. Such an arrangement of the Josephson junctions 914 and 916 forms a SQUID loop, where the phase biasing may be provided by threading a magnetic field through the gaps 910 and 912 and the SQUID loop. It should be again noted that all constructive elements of the QPU 900 are shown in FIG. 9 not to scale for convenience. Furthermore, the shape of the center superconductor 906 and the superconducting ground plane 908 are also illustrative and may be modified, depending on particular applications.

Figure 10:
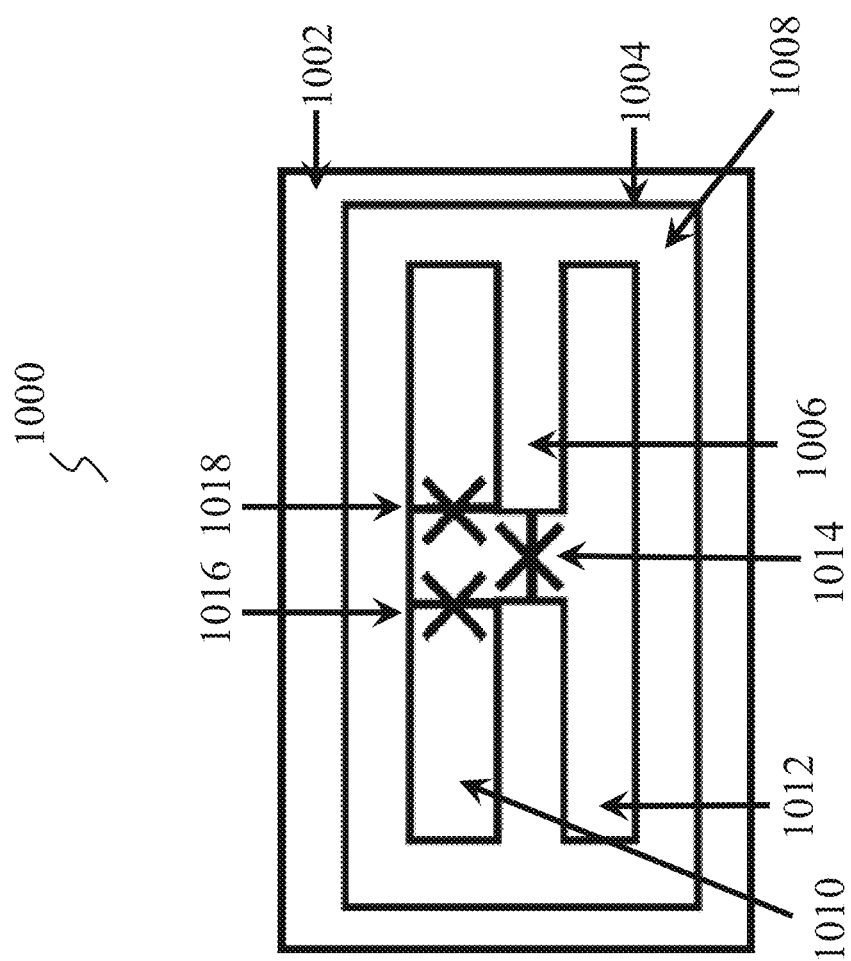
FIG. 10 shows a schematic top view of a QPU, in accordance with a third exemplary embodiment.

FIG. 10 shows a schematic top view of a QPU 1000 in accordance with a third exemplary embodiment. Similar to the QPU 100 in the first embodiment and the QPU 900 in the second embodiment, the QPU 1000 comprises a dielectric substrate 1002 and a superconducting qubit 1004 provided on the dielectric substrate 1002. In the third embodiment, the superconducting qubit 1004 is also configured as a CPW resonator comprising a center superconductor 1006 and a superconducting ground plane 1008. The superconductor 1006 is galvanically connected to the superconducting ground plane 1008 on a first pair of opposite sides (i.e. left and right sides, as shown in FIG. 10). At the same time, the superconductor 1006 is separated by equal gaps 1010 and 1012 from the superconducting ground plane 1008 on a second pair of opposite sides (i.e. top and bottom sides, as shown in FIG. 10). The superconductor 1006 serves as the linear inductive-energy element of the superconducting qubit 1004. Contrary to the first and second embodiments, the non-linear inductive-energy element in the third embodiment is represented by a combination of three Josephson junctions 1014, 1016 and 1018. The Josephson junction 1014 is embedded in the center superconductor 1006, while the Josephson junctions 1016 and 1018 are arranged in the top gap 1010 in the vicinity of the Josephson junction 1014 such that the Josephson junctions 1016 and 1018 connect the center superconductor 1006 to the ground plane 1008. The shown arrangement of the Josephson junctions 1014, 1016 and 1018 is not limitative and may be modified, depending on particular applications. For example, one of the Josephson junctions 1016 and 1018 may be omitted or may be arranged in the other bottom gap 1012 in the vicinity of the Josephson junction 1014. What is important is that the Josephson junctions 1014, 1016 and 1018 are again embedded in the superconducting qubit 1004 such that the QPU 1000 is free of superconducting islands. In the meantime, the phase biasing may be provided by the same manner as in the first embodiment, i.e. by threading the magnetic field through the gaps 1010 and 1012. It should be again noted that all constructive elements of the QPU 1000 in FIG. 10 are not shown to scale for convenience. Furthermore, the shape of the center superconductor 1006 and the superconducting ground plane 1008 are also illustrative and may be modified, depending on particular applications.

Figure 11:
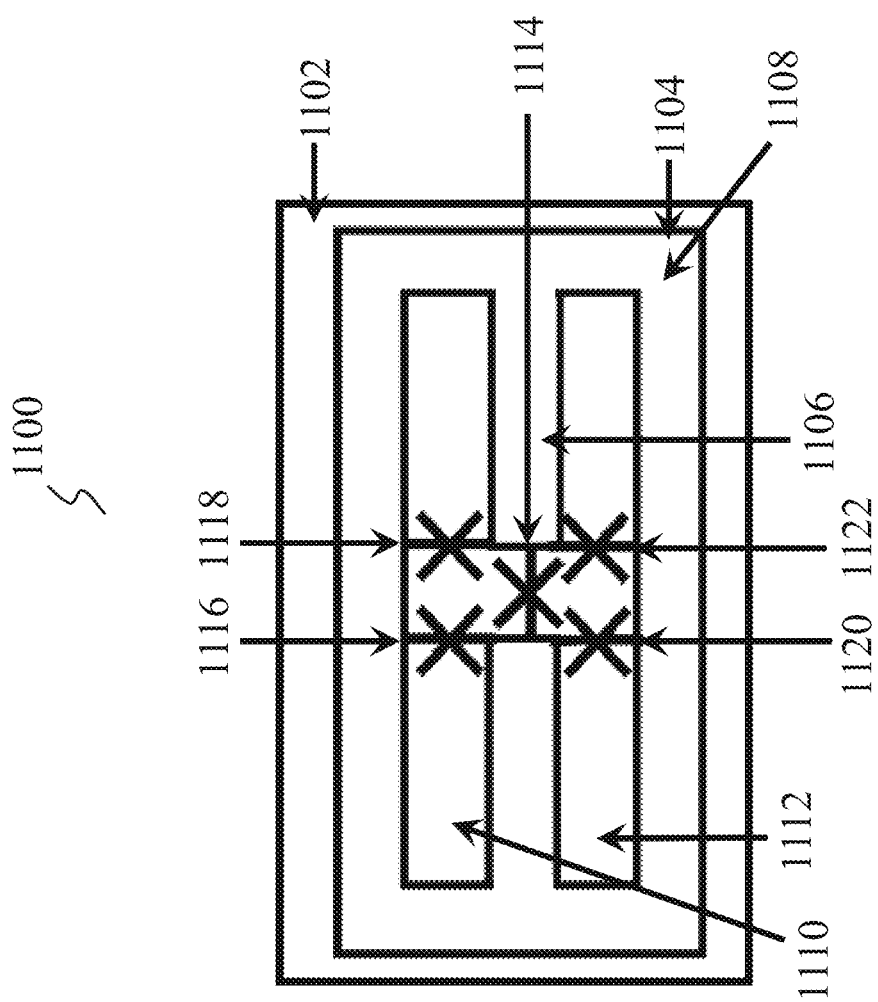
FIG. 11 shows a schematic top view of a QPU, in accordance with a fourth exemplary embodiment.

FIG. 11 shows a schematic top view of a QPU 1100 in accordance with a fourth exemplary embodiment. Similar to the QPU 100 in the first embodiment, the QPU 900 in the second embodiment, and the QPU 1000 in the third embodiment, the QPU 1100 comprises a dielectric substrate 1102 and a superconducting qubit 1104 provided on the dielectric substrate 1102. In the fourth embodiment, the superconducting qubit 1104 is also configured as a CPW resonator comprising a center superconductor 1106 and a superconducting ground plane 1108. The superconductor 1106 is galvanically connected to the superconducting ground plane 1108 on a first pair of opposite sides (i.e. left and right sides, as shown in FIG. 11). At the same time, the superconductor 1106 is separated by equal gaps 1110 and 1112 from the superconducting ground plane 1108 on a second pair of opposite sides (i.e. top and bottom sides, as shown in FIG. 11). The superconductor 1106 serves as the linear inductive-energy element of the superconducting qubit 1104. Contrary to the first, second and third embodiments, the non-linear inductive-energy element in the fourth embodiment is represented by a combination of five Josephson junctions 1114, 1116, 1118, 1120 and 1122. The Josephson junction 1114 is embedded in the center superconductor 1106, while the Josephson junctions 1116-1122 are arranged in the gaps 1110 and 1112 in the vicinity of the Josephson junction 1114 such that the Josephson junctions 1116 and 1118 connect the center superconductor 1106 to the ground plane 1108 via the top gap 1110, and the Josephson junctions 1120 and 1122 connect the center superconductor 1106 to the ground plane 1108 via the bottom gap 1112. The shown arrangement of the Josephson junctions 1114-1122 is not limitative and may be modified, depending on particular applications. For example, one or more of the Josephson junctions 1116-1122 may be omitted. What is important is that the Josephson junctions 1114-1122 are again embedded in the superconducting qubit 1104 such that the QPU 1100 is free of superconducting islands. In the meantime, the phase biasing may be provided by the same manner as in the first and third embodiments, i.e. by threading the magnetic field through the gaps 1110 and 1112. It should be again noted that all constructive elements of the QPU 1100 are shown in FIG. 11 not to scale for convenience. Furthermore, the shape of the center superconductor 1106 and the superconducting ground plane 1108 are also illustrative and may be modified, depending on particular applications.

In the third and fourth embodiments, if there is an even number of Josephson junctions arranged in the gaps between the center superconductor and the superconducting ground plane, these Josephson junctions may be arranged symmetrically or asymmetrically relative to the Josephson junction embedded in the center superconductor, depending on particular applications.

In some other embodiments, the QPU (e.g., any of the QPUs 100, 900-1100) further comprises signal lines provided on the dielectric substrate. The signal lines may be used to provide (e.g., from an external control unit or control electronics if the QPU is used in the quantum computer) control signals to the superconducting qubit(s). The signal lines may comprise radio-frequency lines, and the control signals may comprise microwave pulses. The control signals may allow one to control the superconducting qubit(s) in a desired manner.

In some other embodiments, the QPU (e.g., any of the QPUs 100, 900-1100) further comprises readout lines provided on the dielectric substrate. The readout lines may be included in the QPU in combination with the signal lines. The readout lines may be coupled to the superconducting qubit(s) via readout resonators. The readout lines may be used to take state measurements of the superconducting qubit(s), if required.

Although the exemplary embodiments of the invention are described herein, it should be noted that various changes and modifications could be made in the embodiments of the invention, without departing from the scope of legal protection which is defined by the appended claims. In the appended claims, the word "comprising" does not exclude other elements or operations, and the indefinite article "a" or "an" does not exclude a plurality. The mere fact that certain measures are recited in mutually different dependent claims does not indicate that a combination of these measures cannot be used to advantage.

The invention claimed is:

1. A quantum processing unit comprising:
   a dielectric substrate; and
   at least one superconducting qubit provided on the dielectric substrate, each of the at least one superconducting qubit including:
      a distributed-element resonator comprising at least two conductors separated by at least one gap, wherein the distributed-element resonator is configured as a coplanar waveguide (CPW) resonator, and the at least two conductors comprise a center superconductor and a superconducting ground plane, the center superconductor serving as a linear inductive-energy element,
      a non-linear inductive-energy element including at least one Josephson element embedded in the CPW resonator such that the respective superconducting qubit is free of isolated superconducting islands, and
      a phase-biasing element,
   wherein the phase-biasing element is configured to bias a superconducting phase difference across the linear inductive-energy element and the non-linear inductive-energy element by generating and threading a magnetic field through the at least one gap of the distributed-element resonator such that quadratic potential energy terms associated with the linear inductive-energy element and the non-linear inductive-energy element are at least partly cancelled by one another, and
   wherein the phase-biasing element comprises at least one of (i) one or more coils, or (ii) flux-bias lines.

2. The unit of claim 1, wherein the phase-biasing element is configured to bias the superconducting phase difference such that the quadratic potential energy terms of the linear inductive-energy element and the non-linear inductive-energy element are cancelled by one another by at least 30%.

3. The unit of claim 1, wherein the linear inductive-energy element comprises one or more geometric inductors.

4. The unit of claim 1, wherein the non-linear inductive-energy element comprises one or more Josephson junctions or kinetic inductors.

5. The unit of claim 1, wherein each of the at least one superconducting qubit further comprises a capacitive-energy element.

6. The unit of claim 5, wherein the capacitive-energy element comprises one or more gap capacitors such as interdigitated capacitors, parallel-plate capacitors, or junction capacitors.

7. The unit of claim 1, wherein the phase-biasing element is configured to bias the superconducting phase difference additionally by applying a predefined voltage to the non-linear inductive-energy element.

8. The unit of claim 1, wherein the at least one superconducting qubit comprises two or more superconducting qubits that are at least one of capacitively or inductively coupled to each other on the dielectric substrate.

9. The unit of claim 1, wherein the at least one superconducting qubit comprises two or more superconducting qubits, and
   wherein the unit further comprises at least one of (i) one or more coupling resonators, or (ii) tunable couplers for coupling the superconducting qubits on the dielectric substrate.

10. The unit of claim 1, further comprising signal lines provided on the dielectric substrate, the signal lines being configured to provide control signals to the at least one superconducting qubit.

11. The unit of claim 10, wherein the signal lines comprise radio-frequency lines, and wherein the control signals comprise microwave pulses.

12. The unit of claim 1, further comprising readout lines provided on the dielectric substrate, the readout lines being configured for measuring a state of the at least one superconducting qubit.

13. The unit of claim 12, further comprising readout resonators provided on the dielectric substrate, and wherein the readout lines are coupled to the at least one superconducting qubit via the readout resonators.

14. The unit of claim 1, wherein the center superconductor of the CPW resonator has a first pair of opposite sides and a second pair of opposite sides, and wherein the superconducting ground plane is formed on the dielectric substrate such that the center superconductor is galvanically connected to the superconducting ground plane on the first pair of opposite sides and separated by the gaps from the superconducting ground plane on the second pair of opposite sides.

15. The unit of claim 1, wherein the superconducting ground plane comprises opposite portions physically separated from each other by the center superconductor and the gaps, the opposite portions being connected with each other via air bridges stretching over the gaps and the center superconductor.

16. The unit of claim 1, wherein the at least one Josephson junction is embedded in the center superconductor.

17. The unit of claim 16, wherein the at least one Josephson junction comprises a parallel connection of two Josephson junctions.

18. The unit of claim 16, wherein the at least one Josephson junction is centrally arranged in the center superconductor.

19. The unit of claim 1, wherein the at least one Josephson junction comprises:
 a first Josephson junction embedded in the center superconductor; and
 at least one second Josephson junction arranged in one or more of the gaps in the vicinity of the first Josephson junction, each of the at least one second Josephson junction connecting the center superconductor to the superconducting ground plane via the corresponding gap.

20. The unit of claim 19, wherein the at least one second Josephson junction comprises an even number of second Josephson junctions arranged symmetrically relative to the first Josephson junction.

21. The unit of claim 19, wherein the first Josephson junction is centrally arranged in the center superconductor.

22. The unit of claim 1, wherein the center superconductor has a linear or curved shape.

23. The unit of claim 1, further comprising at least one 3D cavity, and wherein the dielectric substrate with the at least one superconducting qubit is provided in the at least one 3D cavity.

24. A quantum computer comprising at least one quantum processing unit according to claim 1 and a control unit configured to perform computing operations by using the at least one quantum processing unit.

* * * * *